United States Patent
Huang et al.

(10) Patent No.: US 7,297,576 B2
(45) Date of Patent: Nov. 20, 2007

(54) METHOD FOR FABRICATING THIN FILM TRANSISTOR (TFT) DISPLAY

(75) Inventors: Liang-Yin Huang, Hsinchu (TW);
Jia-Chong Ho, Hsinchu (TW);
Cheng-Chung Lee, Hsinchu (TW);
Chi-Chang Liao, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 316 days.

(21) Appl. No.: 11/195,791

(22) Filed: Aug. 3, 2005

(65) Prior Publication Data

US 2006/0275959 A1    Dec. 7, 2006

(30) Foreign Application Priority Data

Jun. 3, 2005    (TW) ............................. 94118488 A

(51) Int. Cl.
*H01L 21/84*    (2006.01)
(52) U.S. Cl. ................. 438/149; 257/E21.441
(58) Field of Classification Search ............. 438/149, 438/455, 458
See application file for complete search history.

(56) References Cited

U.S. PATENT DOCUMENTS

2004/0178527 A1    9/2004    Liao et al.

FOREIGN PATENT DOCUMENTS

JP    2004-280041    7/2004
TW    594339    6/2004

OTHER PUBLICATIONS

Jia-Chong Ho et al., "Pentacene Organic Thin-Film Transistor Integrated with Color Twisted Nematic Liquid Crystals Display (CTNLCD)", 2004.

Joost P. A. Vogels et al., "Robust Flexible LCDs with Paintable Technology", 2004.

*Primary Examiner*—Scott B. Geyer
*Assistant Examiner*—Elias Ullah
(74) *Attorney, Agent, or Firm*—Rabin & Berdo, P.C.

(57) ABSTRACT

A method for fabricating a thin film transistor (TFT) display is provided, wherein the processes of a liquid crystal substrate and an organic thin film transistor (OTFT) substrate are separated. The fabrication of liquid crystal substrate employs the technology of polymer encapsulated liquid crystal molecule, and leaves the polymeric layer as a substrate using a sacrificial layer, so as to improve the flexibility. And the TFT substrate has a high adhesive polymeric protective layer provided on its surface, so as to combine the fabricated TFT substrate and the liquid crystal substrate by laminating. Thereby, the processes of the liquid crystal substrate and the TFT substrate will not affect each other, to improve the process yield and meet the demand for the variety of products.

17 Claims, 5 Drawing Sheets

METHOD FOR FABRICATING THIN FILM TRANSISTOR (TFT) DISPLAY

BACKGROUND

1. Field of Invention

The present invention relates to a method for fabricating a thin film transistor (TFT) display, in particular, to a method for fabricating a TFT display wherein the display section and TFT section are recombined after being processed separately, thereby improving the process yield.

2. Related Art

In recent years, flexible flat panel display has the advantages such as low power consumption and high image quality, therefore it soon becomes the focus product since it came into the market. At the same time, based on the market demands for accommodation, portability and convenience, efforts have been exerted to develop flexible liquid crystal display (Flexi LCD) by those skilled in the art around the world, and many big companies have joined in this "display revolution" one after another. Organic thin film transistor (OTFT) makes use of organic molecule materials to develop TFTs adapted for electronic products. The transistor element may maintain its property and achieve normal image quality effect when the panel is bended. Such application accelerates the accomplishment of the flexible electronic products (such as displays), and has a lower cost.

Due to the wide application range of flexible electronic products, for example, from various portable electronic products to large-scale advertising signboard, the diversity of the products and the variety of the display modes are among the important factors to be considered in the commercialization of this technology.

As in the prior art, Philips Electronics of Netherlands has proposed modes of fabricating polymer dispersed liquid crystal (PDLC) and electronic ink technology (E-ink) displays directly on the organic thin film transistor (OTFT). However, its disadvantage resides in that the display section cannot be fabricated until the fabrication of the OTFT is finished, and the OTFT section might be damaged while fabricating the display section, thereby resulting in a lowered yield.

SUMMARY

In view of the above problems, an object of the invention is to provide a method for fabricating a TFT display, wherein using the property of polymeric material, the display substrate and TFT substrate can be combined together by laminating after separate process, thereby achieving the improved yield and varied TFT display modes, and substantially solving the problems in the prior art.

Therefore, in order to achieve the above object, the method for fabricating the TFT display disclosed in the invention comprises the following steps: first, providing a sacrificial layer which includes a support substrate and a release layer, wherein the support substrate is used for supporting, and the release layer is convenient to release the elements described below from the support substrate; then, forming a polymer layer on the sacrificial layer; and then fabricating an alignment layer on the polymer layer; afterwards, forming an electrode layer on the alignment layer; next, forming a precursor mixed layer fabricated by mixing liquid crystal and polymer, and illuminating the entire or part of the precursor mixed layer, separating the liquid crystal and polymer so as to form polymer spacers and an upper plate to encapsulate the liquid crystal on the electrode layer to fabricate a liquid crystal substrate; subsequently, providing a TFT substrate having a adhesive polymeric protective layer on the surface, and combining the TFT substrate and the liquid crystal substrate by laminating; finally, removing the sacrificial layer of the liquid crystal substrate, and the TFT display is fabricated.

Wherein, since the protective layer of the TFT substrate is a polymeric material, which is selected from thermoset or photopolymerizable materials, the polymeric material is cured and polymerized through heating and illuminating, to combine with the liquid crystal substrate. In addition, the step of removing the sacrificial layer has made the bottom layer of the liquid crystal substrate into a polymer layer, and the bottom layer of the TFT substrate of the present invention may also be made of polymer, therefore the flexibility of the TFT display can be improved, and various TFT display modes can be increased.

To further understand the object, structure, features and functions of the present invention, further details will be given with reference to the embodiments as follows.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
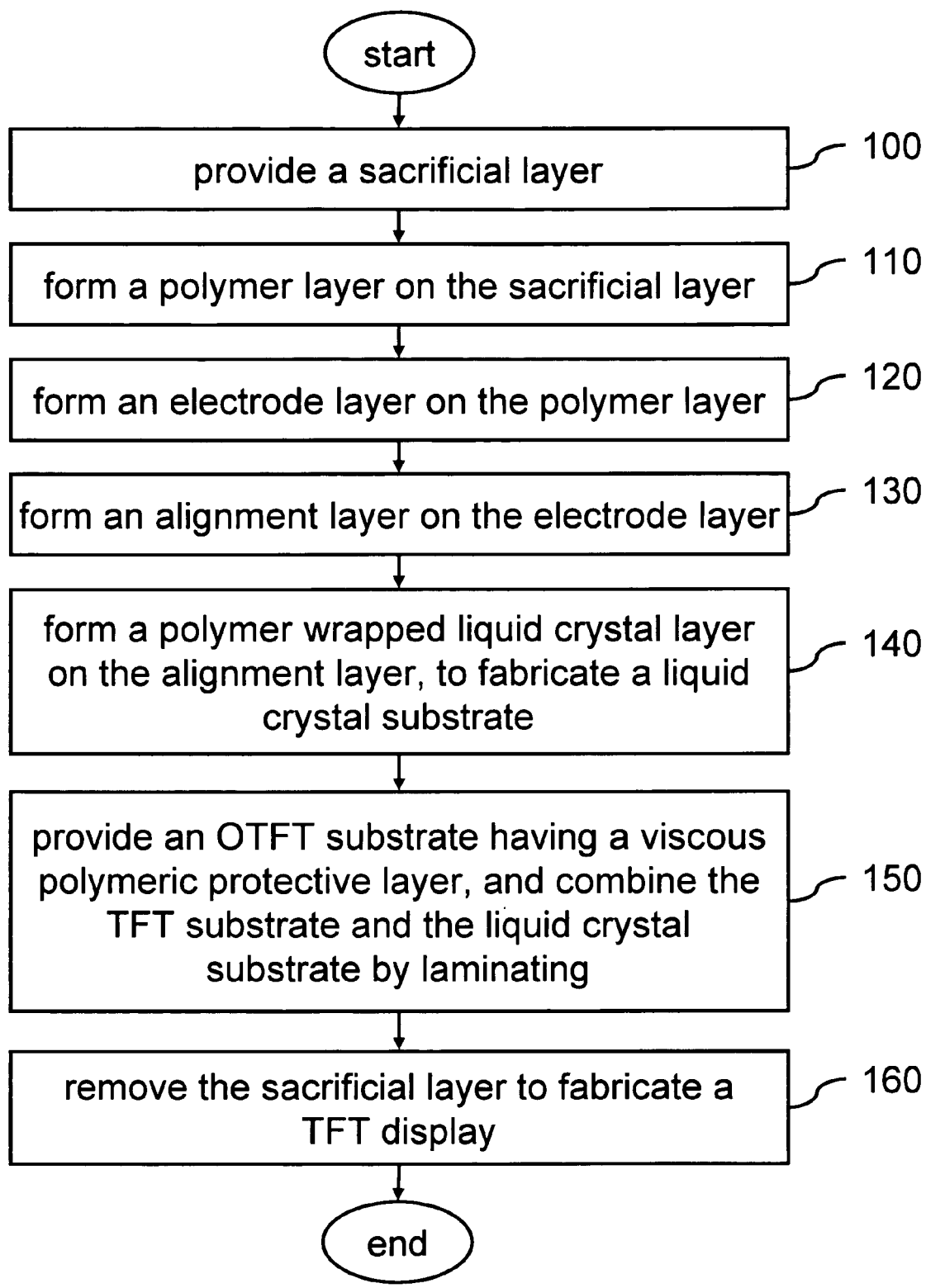
FIG. 1 is a flowchart of the method for fabricating a TFT display according to the present invention.

With reference to FIG. 1, the method for fabricating the OTFT primarily comprises the steps as follows:

First, providing a sacrificial layer (step 100); then, forming a polymer layer on the sacrificial layer (step 110); and then forming an electrode layer on the polymer layer (step 120); afterwards, forming an alignment layer on the electrode layer (step 130); next, forming a polymer encapsulated liquid crystal layer on the alignment layer so as to fabricate a liquid crystal substrate (step 140); subsequently, providing an OTFT substrate having a adhesive polymeric protective layer, and combining the TFT substrate and the liquid crystal substrate by laminating (step 150); finally, removing the sacrificial layer, and the TFT display is fabricated (step 160).

Wherein, the TFT substrate employed in the invention is made of TFT selected from the group consisting of organic, inorganic TFT materials or a mixture of both. Taking only the OTFT for example hereinafter, and referring to FIGS. 2A to 2I in order, the fabrication of the OTFT display of the embodiments of the present invention is described.

Figure 2A:
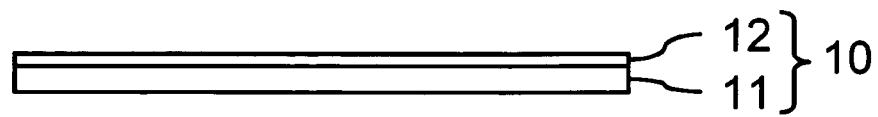
FIGS. 2A to 2I is the process of fabricating an OTFT display according to the embodiment of the present invention.

As shown in FIG. 2A, first, a support substrate 11 is coated on a removable release layer 12 to constitute a sacrificial layer 10 (step 100). The support substrate 11 is used for supporting the elements described below, and the removable release layer 12 can release the elements described below from the support substrate 11.

Figure 2B:
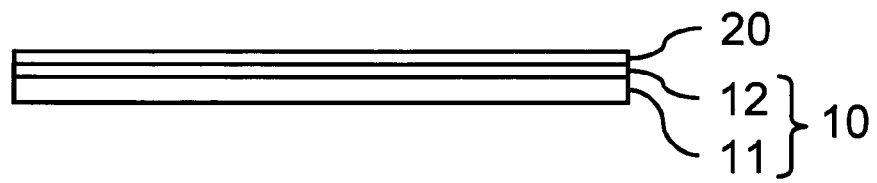

Then, as shown in FIG. 2B, a polymer layer 20 is formed on the release layer 12 of the sacrificial layer 10 (step 110). The polymer layer 20 has a thickness between 3 and 25 micrometers (μm), and its material is polyimide (PI).

Figure 2C:
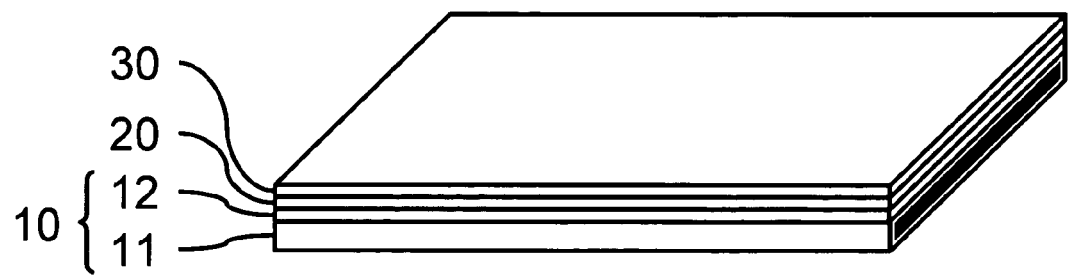

Then, as shown in FIG. 2C, an electrode layer 30 is fabricated on the polymer layer 20 (step 120).

Figure 2D:
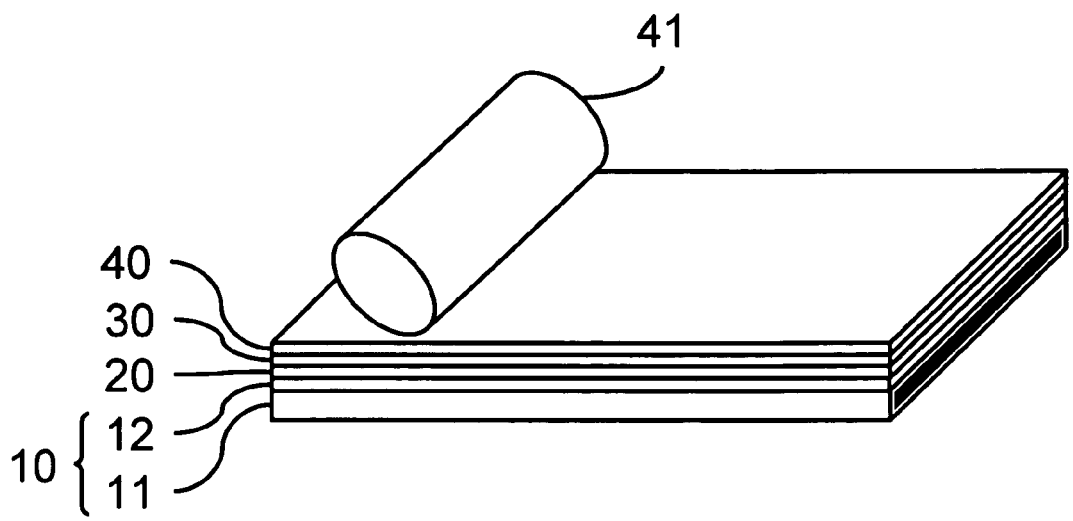

As shown in FIG. 2D, further alignment is conducted on the electrode layer 30 (step 130), wherein first coating an alignment layer 40 (e.g., polyimide) on the electrode layer 30, and then creating periodical groove structures on the surface of the alignment layer through rub of an alignment fabric 41 by rubbing alignment technology, to induce the liquid crystal molecules formed subsequently to arrange along the groove regularly, or adding a material layer of illumination-induced alignment effect into the electrode layer 30 to carry out the alignment of liquid crystal molecules.

Figure 2E:
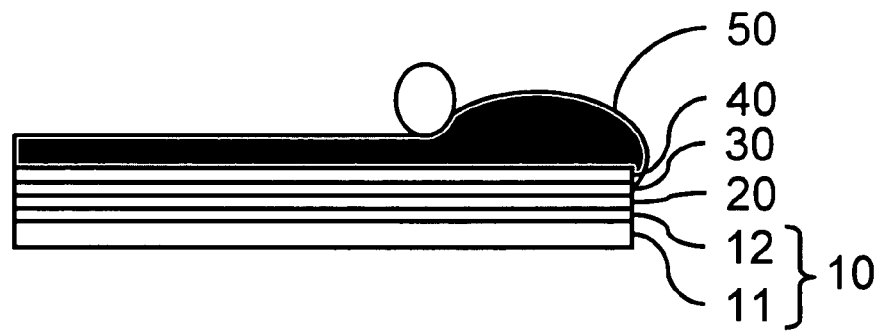
Figure 2F:
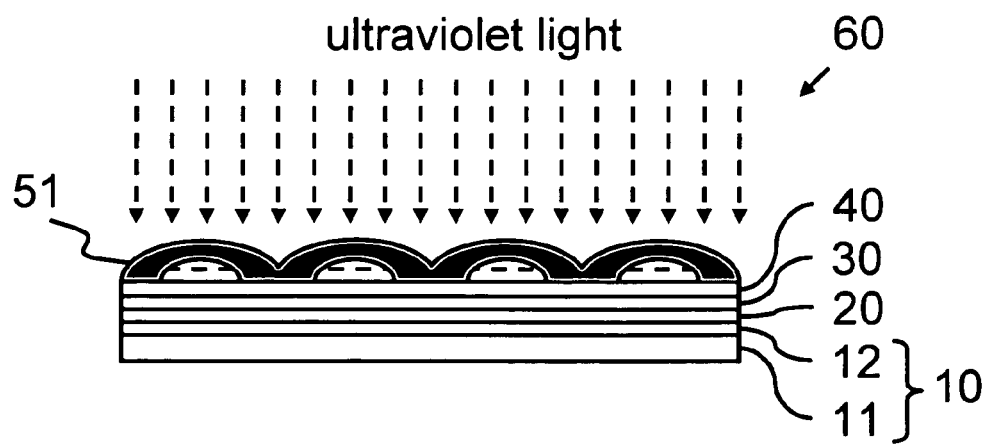

Afterwards, as shown in FIG. 2E, the precursor mixed layer 50 by mixing the liquid crystal and the polymer is coated on the alignment layer 40, wherein the polymer of the precursor mixed layer 50 is a photopolymerizable material. As shown in FIG. 2F, the liquid crystal and the polymer are separated by ultraviolet light illumination, so as to form a polymer encapsulated liquid crystal layer 51 on the alignment layer 40, so as to fabricate the liquid crystal substrate 60 (step 140).

Figure 2G:
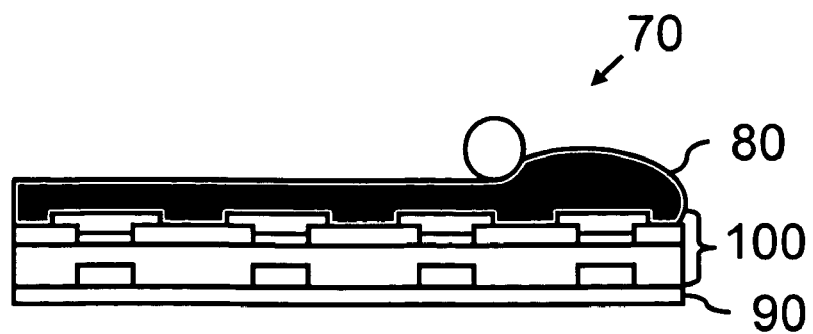
Figure 2H:
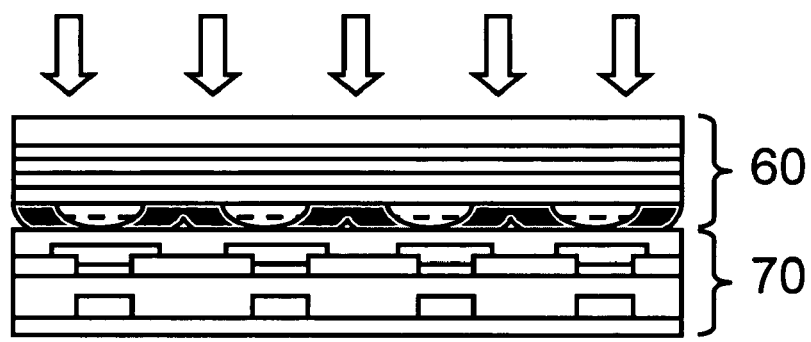

Again, as shown in FIG. 2G, an OTFT substrate 70 is provided. Here, an array of OTFTs 100 of the bottom gate pattern is directly formed on the polymer support substrate 90, and the surface is covered with a protective layer 80 having adhesive polymer (e.g., polyvinyl alcohol (PVA)), to function as a protection and an enclosure. As shown in FIG. 2H, the fabricated liquid crystal substrate 60 and the OTFT substrate 70 can be affixed together by laminating, as long as they are aligned with each other (step 150).

Figure 2I:
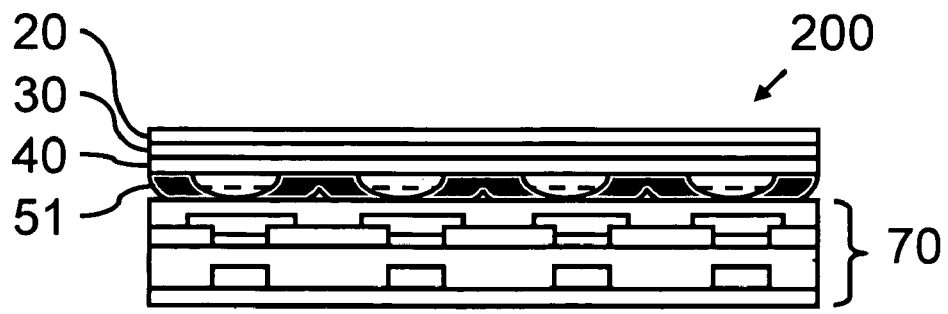

Finally, as shown in FIG. 2I, the release layer 12 strips the entire sacrificial layer 10, so that an OTFT display 200 is fabricated (step 160).

Since in this embodiment, the support substrate 11 used for supporting the liquid crystal substrate may be removed by release technology, the entire OTFT display 200 can be made very thin (less than 150 μm), and both the upper and lower surfaces of the OTFT display 200 of this embodiment are polymeric materials, making it highly flexible.

Figure 3:
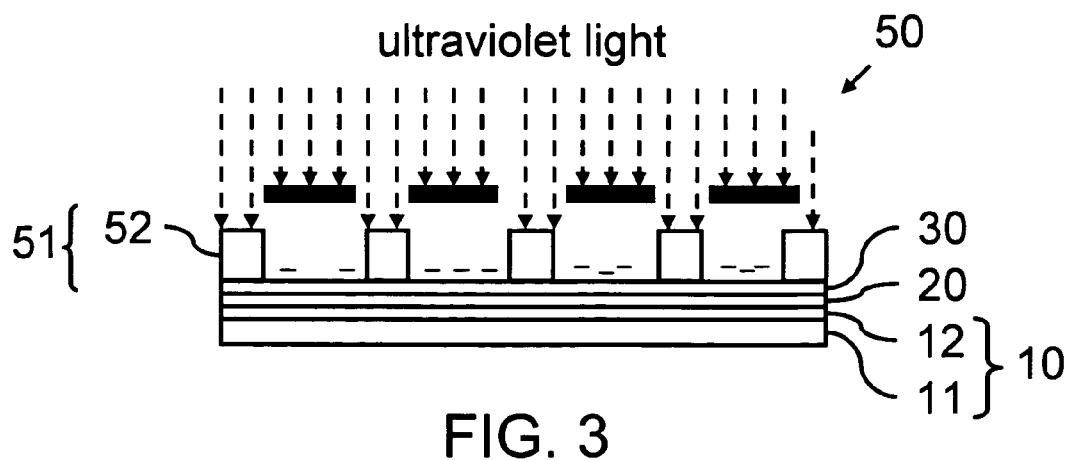
FIG. 3 is a schematic view of forming a polymer encapsulated liquid crystal layer by using partial illumination according to the embodiment of the present invention.

Additionally, this embodiment employs the illumination for the entire precursor mixed layer 50 of the liquid crystal and polymer to form a film-shaped polymer encapsulated liquid crystal layer 51 (as shown in FIG. 2F). In particular, as shown in FIG. 3, the polymer encapsulated liquid crystal layer 51 including multiple spacers 52 can also be formed through illuminating or molding part of the thermoset polymer of the precursor mixed layer 50 of the liquid crystal and polymer, then aligning it with the OTFT substrate 70, and illuminating and heating the whole layer so that the two are affixed together by laminating (step 150).

Figure 4A:
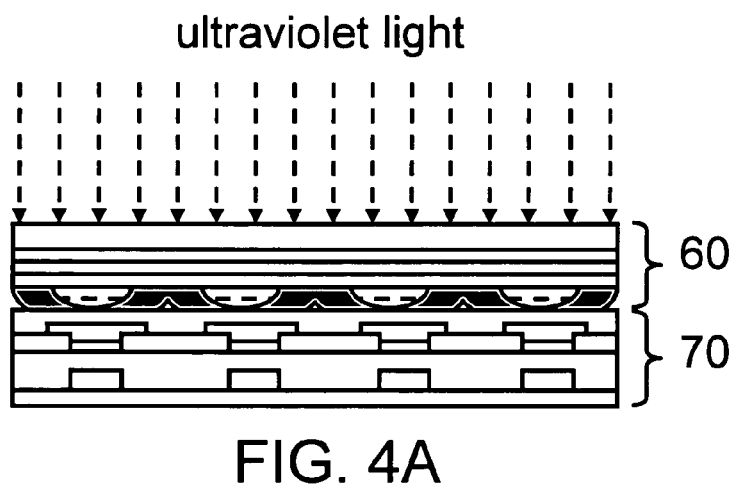
FIGS. 4A and 4B is respectively a schematic view of combining the liquid crystal substrate and the OTFT substrate through heating or illuminating according to the embodiment of the present invention.
Figure 4B:
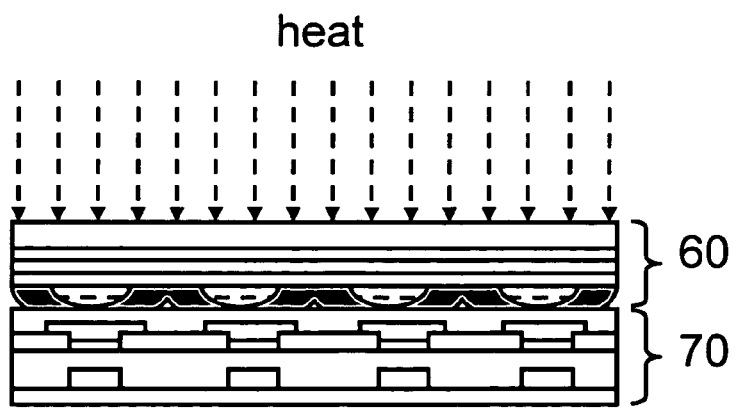

Furthermore, the polymeric protective layer 80 of the OTFT substrate 70 is selected from thermoset or photopolymerized material. As shown in FIGS. 4A and 4B, in the step of combining the OTFT substrate 70 and the liquid crystal substrate 60, the polymeric protective layer is cured and polymerized through heating or illuminating simultaneously, thereby combining the liquid crystal substrate 60 and the OTFT substrate 70.

Still further, the OTFT substrate 70 of this embodiment is selected from the OTFT substrates comprising an OTFT 100 with a bottom contact, top contact, bottom gate or top gate pattern. However, support substrate 90 of the OTFT substrate 70 is either an organic material or an inorganic material, so that the fabricated OTFT display 200 has at least one polymer substrate.

In view of the above, the TFT display according to this invention utilizes polymer to encapsulate liquid crystal molecule, so as to realize the flexible display technology, and combined with the release process, thereby the process rate can be improved greatly. In addition, by using the property of polymer and through laminating, the liquid crystal substrate and the TFT substrate is fabricated separately before combining them together. Therefore, if a TFT display is fabricated with modular process, the temperature and method of the process selected by the liquid crystal substrate and the TFT substrate will not affect each other. Thus, the property of each may be improved to meet the demand for various TFT display modes, and an increased process yield is obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a thin film transistor (TFT) display, comprising the steps of:
   providing a sacrificial layer;
   forming a polymer layer on the sacrificial layer;
   forming an electrode layer on the polymer layer;
   forming an alignment layer on the electrode layer;
   forming a polymer encapsulated liquid crystal layer on the alignment layer, to fabricate a liquid crystal substrate;
   providing a TFT substrate having a polymeric protective layer and combining the TFT substrate with the liquid crystal substrate by a laminating; and
   removing the sacrificial layer, thereby fabricating the TFT display.

2. The method for fabricating the TFT display of claim 1, wherein the TFT substrate is made of a TFT of which a material is selected from the group consisting of an organic TFT material, an inorganic TFT material and a mixture of the organic and the inorganic TFT materials.

3. The method for fabricating the TFT display of claim 1, wherein the sacrificial layer includes a support substrate and a release layer on the support substrate.

4. The method for fabricating the TFT display of claim 1, wherein the step of forming a polymer encapsulated liquid crystal layer on the alignment layer, to fabricate a liquid crystal substrate comprises the steps of:
   forming a precursor mixed layer on the electrode layer, where the precursor mixed layer is made by mixing a liquid crystal and a polymer; and
   separating the liquid crystal and the polymer of the precursor mixed layer using an illumination, to form the polymer encapsulated liquid crystal layer.

5. The method for fabricating the TFT display of claim 4, wherein the step of separating the liquid crystal and the polymer of the precursor mixed layer using an illumination is implemented by illuminating the entire precursor mixed layer.

6. The method for fabricating the TFT display of claim 4, wherein the step of separating the liquid crystal and the polymer of the precursor mixed layer using an illumination is implemented by illuminating a partial of the precursor mixed layer, to form the polymer encapsulated liquid crystal layer having a plurality of spacers.

7. The method for fabricating the TFT display of claim 4, wherein the polymer of the precursor mixed layer is selected from the group consisting of a photopolymerizable material.

8. The method for fabricating the TFT display of claim 1, wherein the step of combining the TFT substrate with the liquid crystal substrate by a laminating comprises the step of heating the polymeric protective layer of the TFT substrate.

9. The method for fabricating the TFT display of claim 1, wherein the step of combining the TFT substrate with the liquid crystal substrate by a laminating comprises the step of illuminating the polymeric protective layer of the TFT substrate.

10. The method for fabricating the TFT display of claim 1, wherein the polymer layer is polyimide (PI).

11. The method for fabricating the TFT display of claim 10, wherein the polymer layer has a thickness between 3 and 25 micrometer (μm).

12. The method for fabricating the TFT display of claim 1, wherein a material of the polymeric protective layer is selected from the group consisting of a thermoset material and a photopolymerizable material.

13. The method for fabricating the TFT display of claim 12, wherein the material of the polymeric protective layer is a polyvinyl alcohol (PVA).

14. The method for fabricating the TFT display of claim 12, wherein the polymeric protective layer comprises an inorganic material.

15. The method for fabricating the TFT display of claim 1, wherein the TFT substrate is made of a TFT selected from the group consisting of a bottom contact, a top contact, a bottom gate and a top gate thin film transistors.

16. The method for fabricating the TFT display of claim 1, wherein the TFT substrate comprises a polymeric support substrate.

17. The method for fabricating the TFT display of claim 1, wherein the TFT substrate comprises a support substrate of an inorganic material.

* * * * *